United States Patent
Ryu et al.

(10) Patent No.: US 7,034,557 B2
(45) Date of Patent: Apr. 25, 2006

(54) INSPECTING APPARATUS HAVING A RADIATOR TO RADIATE HEAT FROM A SEMICONDUCTOR DEVICE

(75) Inventors: Je-hyoung Ryu, Suwon (KR); Tae-gyu Kim, Hwasung (KR); Jun-ho Lee, Yongin (KR); Sung-jin Lee, Suwon (KR); Hong-yong Lee, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/820,748

(22) Filed: Apr. 9, 2004

(65) Prior Publication Data

US 2004/0263193 A1    Dec. 30, 2004

(30) Foreign Application Priority Data

Jun. 26, 2003    (KR) .................. 10-2003-0042145

(51) Int. Cl.
*G01R 31/26* (2006.01)
(52) U.S. Cl. ...................... 324/760; 324/765
(58) Field of Classification Search ............. 324/760, 324/765; 165/80.3–80.4, 104.1, 104.21, 165/272; 361/697
See application file for complete search history.

(56) References Cited

U.S. PATENT DOCUMENTS 4,839,587 A * 6/1989 Flatley et al. ............ 324/761
4,951,740 A * 8/1990 Peterson et al. ......... 165/276
5,006,796 A * 4/1991 Burton et al. ............ 324/760
5,744,863 A   4/1998 Culnane et al.

FOREIGN PATENT DOCUMENTS

| KR | 1999-000619 | 1/1999 |
| KR | 2000-0052405 | 8/2000 |
| KR | 2002-0061468 | 7/2002 |
| KR | 2002-0078718 | 10/2002 |
| KR | 2002-0087227 | 11/2002 |

OTHER PUBLICATIONS

Korean Office Action issued on Jul. 12, 2005.

* cited by examiner

*Primary Examiner*—Vinh P. Nguyen
(74) *Attorney, Agent, or Firm*—Staas & Halsey LLP (57) ABSTRACT

An inspecting apparatus for a semiconductor device includes a match plate; a contact module combined with the match plate and including a radiator to radiate heat from the semiconductor device to the outside and a tester to contact the leads of the semiconductor device; and a heat pipe provided in the radiator. The inspecting apparatus performs testing at a constant temperature, regardless of heat from the semiconductor device, by transferring the heat quickly and efficiently, thereby producing more accurate test results. The apparatus also improves productivity and saves expense by removing faulty test results caused by incorrectly identifying a qualified semiconductor device as a defective semiconductor device.

27 Claims, 9 Drawing Sheets

FIG. 7C

INSPECTING APPARATUS HAVING A RADIATOR TO RADIATE HEAT FROM A SEMICONDUCTOR DEVICE

CROSS-REFERENCE TO RELATED APPLICATIONS

This application claims the benefit of Korean Patent Application No. 2003-042145, filed Jun. 26, 2003, in the Korean Intellectual Property Office, the disclosure of which is incorporated herein by reference.

BACKGROUND OF THE INVENTION

1. Field of the Invention

The present invention relates to an inspecting apparatus for semiconductor devices, and more particularly, to an inspecting apparatus for semiconductor devices having an improved radiator to cool the semiconductor devices during testing.

2. Description of the Related Art

Handler devices are used for testing the durability of semiconductor devices against heat, and generally comprise a handler to distinguish defective semiconductor devices from qualified semiconductor devices, and a chamber to maintain a constant temperature during testing.

Heat radiated from semiconductor devices during testing may change the electrical properties of the semiconductor devices. Consequently, a qualified semiconductor device may be incorrectly identified as a defective semiconductor device. In this case, the testing needs to be repeated. A core technology of the chamber to prevent the disadvantage described above is focused on heating/cooling technology to transfer heat from the semiconductor devices to the outside in order to maintain a constant temperature during a performance of a test, regardless of the heat radiated from the semiconductor device.

In conventional inspecting apparatuses for semiconductor devices that are provided with radiators, heat can not be quickly or efficiently transferred away from semiconductor devices.

SUMMARY OF THE INVENTION

Accordingly, it is an aspect of the present invention to provide an inspecting apparatus for semiconductor devices having an improved radiator structure to cool the semiconductor devices during testing.

The foregoing and/or other aspects of the present invention are achieved by providing an inspecting apparatus for semiconductor devices comprising: a match plate; a contact module combined with the match plate, the match plate comprising a radiator to radiate heat from a semiconductor device to the outside and a tester to contact the leads of a semiconductor device; and a heat pipe provided in the radiator.

According to an aspect of the present invention, the radiator comprises: a heat sink; a contact pusher to contact the semiconductor device; and a heat flat pusher provided between the contact pusher and the heat sink, wherein a heat pipe is provided inside the heat flat pusher to transfer heat from the semiconductor device to the heat sink via the contact pusher.

According to an aspect of the present invention, the tester comprises: a contact block combined with the match plate and having a heat sink seat to accommodate the heat sink and a through hole through which the heat flat pusher passes; and a lead pusher combined with the bottom of the contact block to contact the leads of a semiconductor device selectively using elevation of the contact block by the match plate.

According to an aspect of the present invention, the contact block is formed with an air inlet through which air flows into the heat sink seat and an air outlet through which the air is exhausted to the outside.

According to an aspect of the present invention, the inspecting apparatus for semiconductor devices further comprises a first elastic member installed on part of the heat flat pusher to lift the contact block and the lead pusher up and down elastically.

According to an aspect of the present invention, the inspecting apparatus for semiconductor devices further comprises a second elastic member installed between the match plate and the contact block to press the lead pusher against the leads of a semiconductor device by lowering the contact block elastically using the match plate.

According to an aspect of the present invention, the first elastic member and the second elastic member are springs.

According to an aspect of the present invention, the heat sink, the contact pusher, and the heat flat pusher are made of material containing aluminum.

Additional aspects and/or advantages of the present invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the embodiments, taken in conjunction with the accompany drawings of which.

DETAILED DESCRIPTION OF THE PREFERRED EMBODIMENTS

Reference will now be made in detail to embodiments of the present invention, examples of which are illustrated in the accompanying drawings, wherein like reference numerals refer to like elements throughout. The embodiments are described below in order to explain the present invention by referring to the figures.

Figure 1:
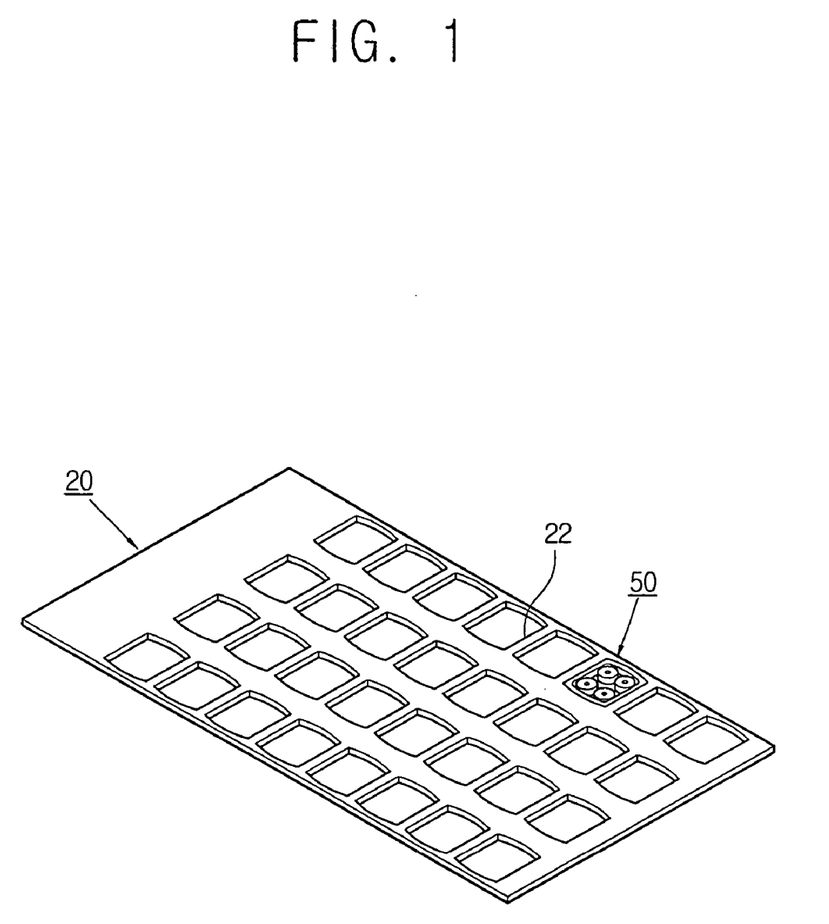
FIG. 1 is a perspective view of an inspecting apparatus for semiconductor devices according to an embodiment of the present invention.

As illustrated in FIG. 1, an inspecting apparatus for a semiconductor device according to the present invention comprises a match plate 20 capable of lifting up and down, and a contact module 50 installed on the match plate 20.

Figure 6:
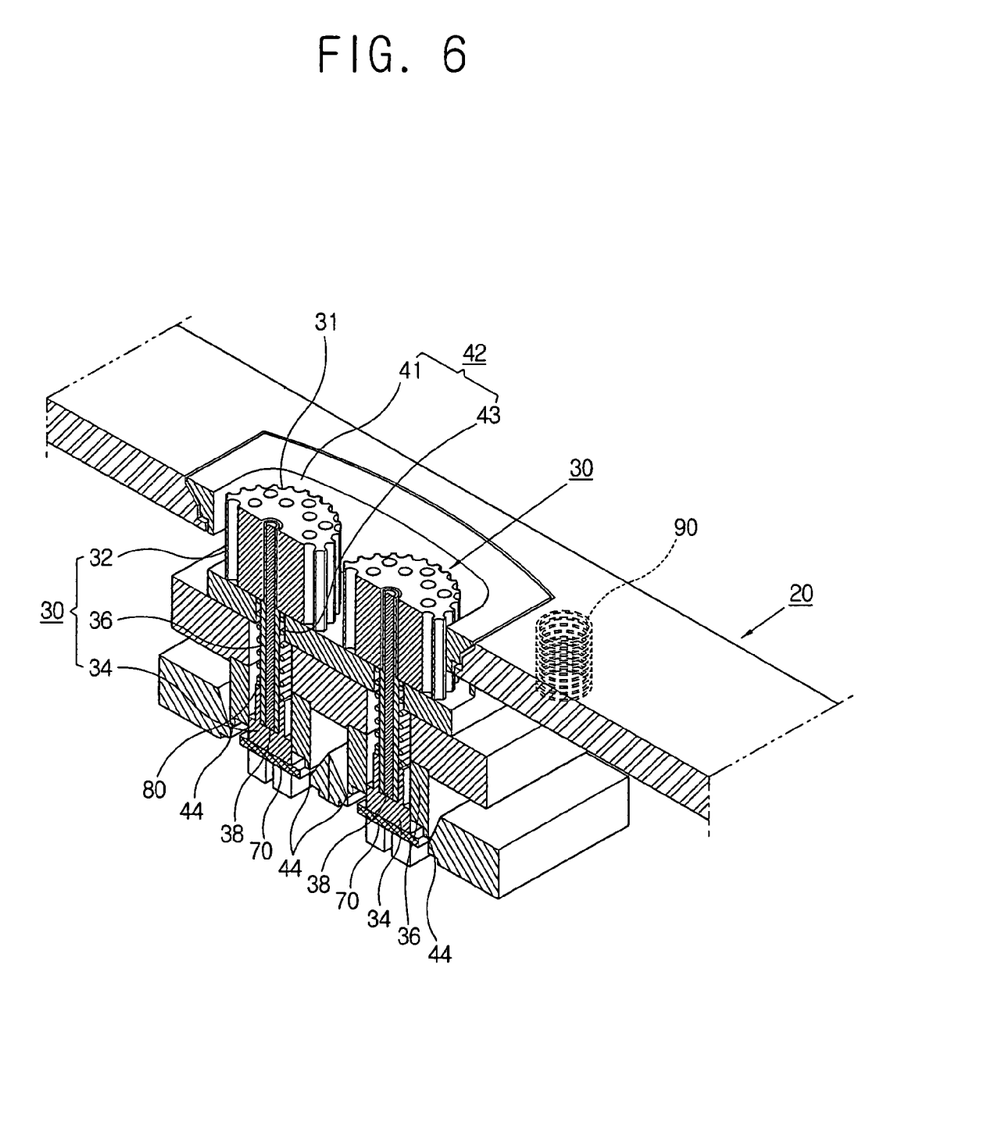
FIG. 6 is a cross-sectional view illustrating a combining structure of the match plate and the contact module of the inspecting apparatus for semiconductor devices according to the present invention.

The match plate 20 is formed with a plurality of combining holes 22 respectively combinable with the plurality of the contact modules 50. As shown in FIG. 6, the match plate 20 lifts a tester 40 of the contact module 50 up and down selectively to test the durability of a semiconductor device 70 against heat. The structure of the match plate 20 may vary as necessary.

Figure 2:
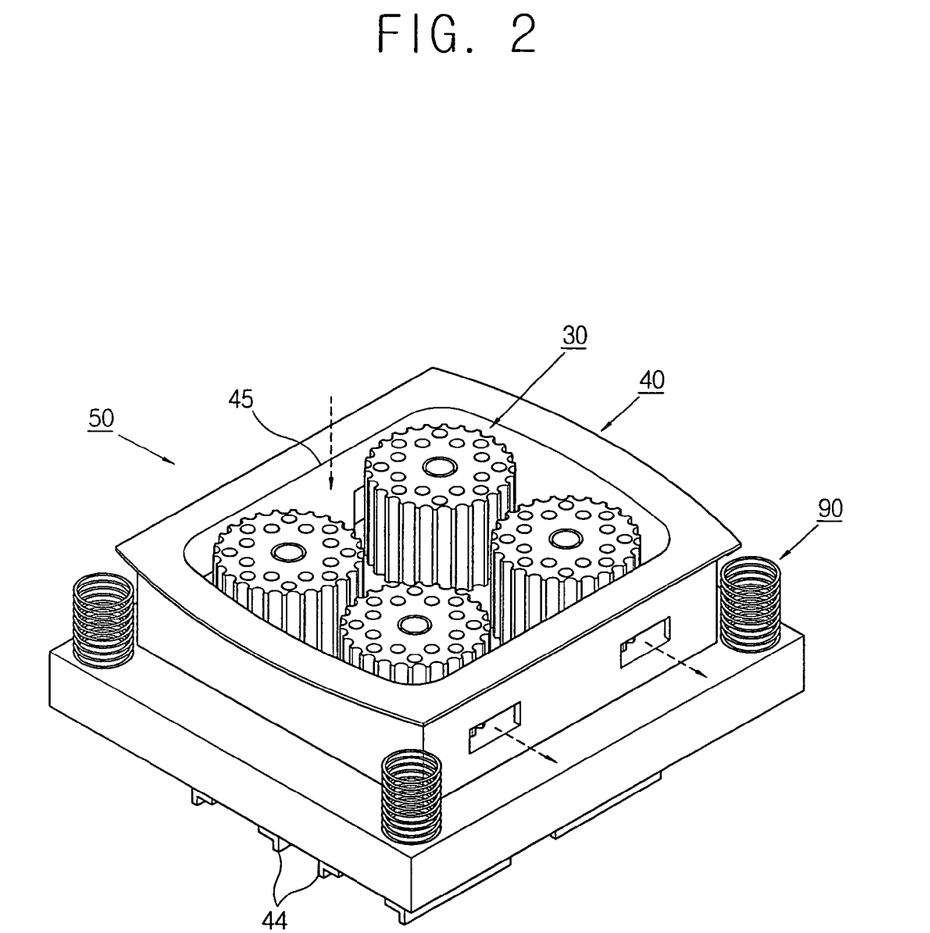
FIG. 2 is a perspective view of a contact module of the inspecting apparatus for semiconductor devices according to the present invention.
Figure 7A:
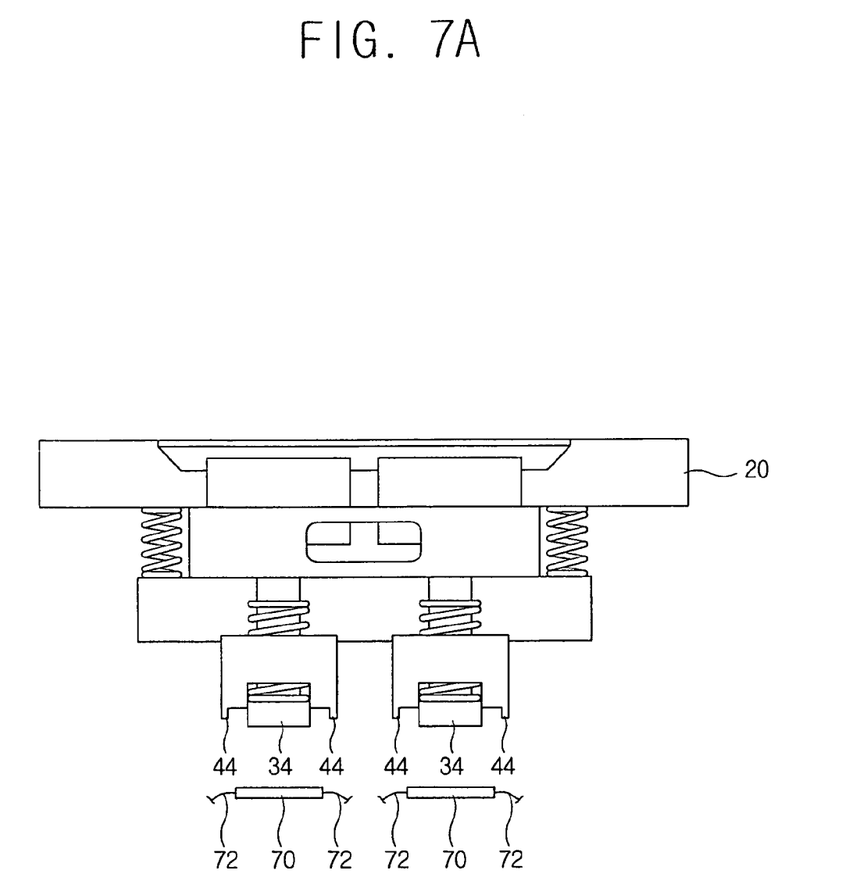
FIGS. 7A through 7C are operational views of the inspecting apparatus for semiconductor devices according to the present invention.
Figure 7B:
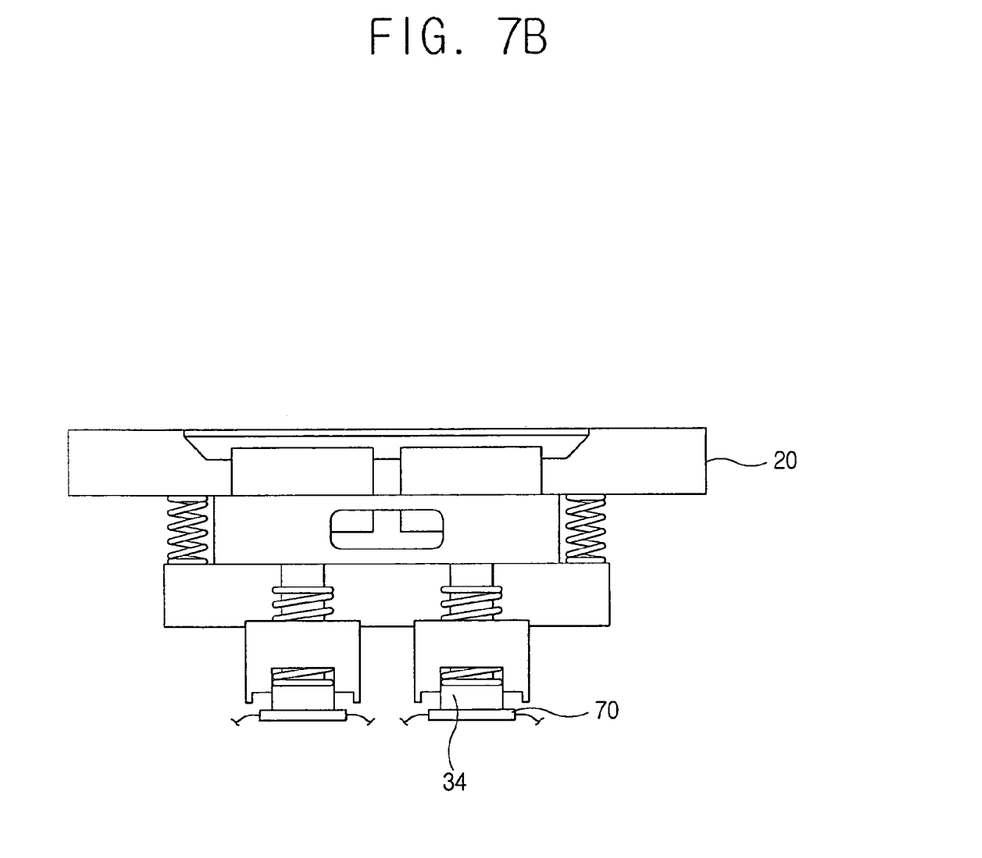
Figure 7C:
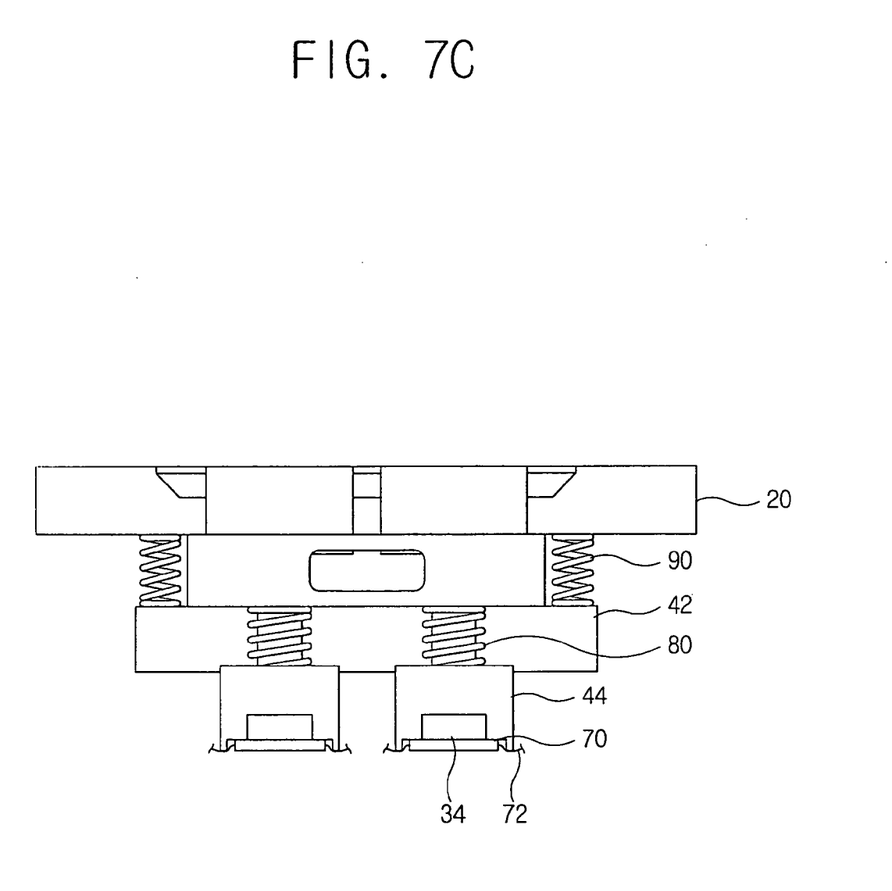

The contact module 50, as shown in FIG. 2, comprises a radiator 30 contacting the semiconductor device 70, and a tester 40 to contact the leads 72 of the semiconductor device 70, as shown in FIGS. 7A–C.

Figure 3:
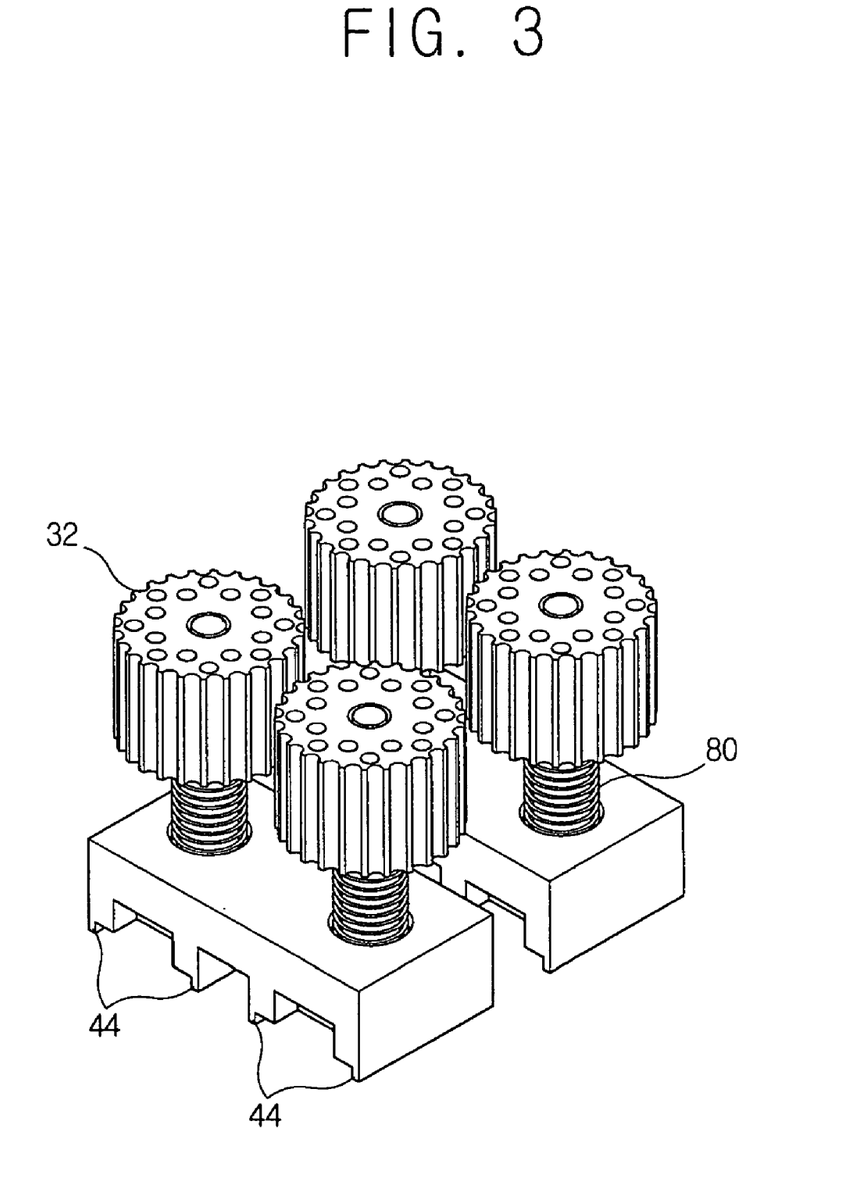
FIG. 3 is a combined perspective view of a radiator and a lead pusher as shown in FIG. 2.
Figure 4:
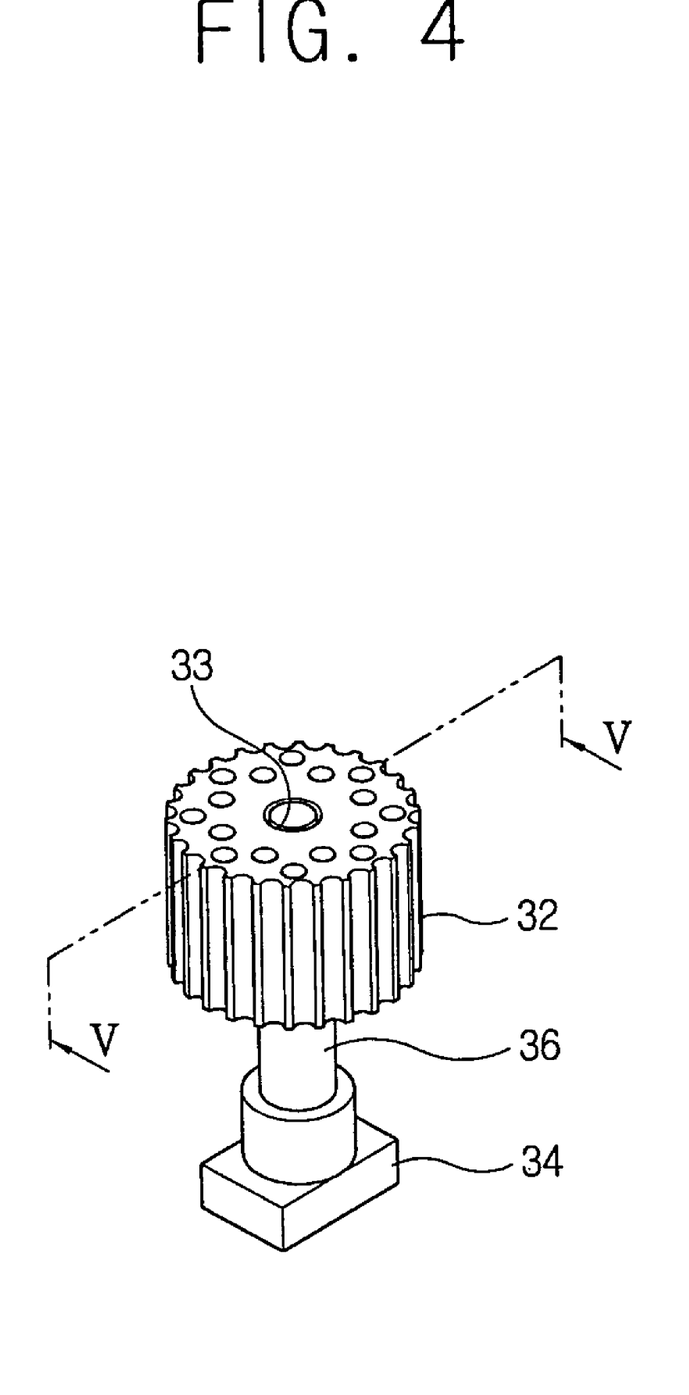
FIG. 4 is a perspective view of the radiator as shown in FIG. 3.
Figure 5:
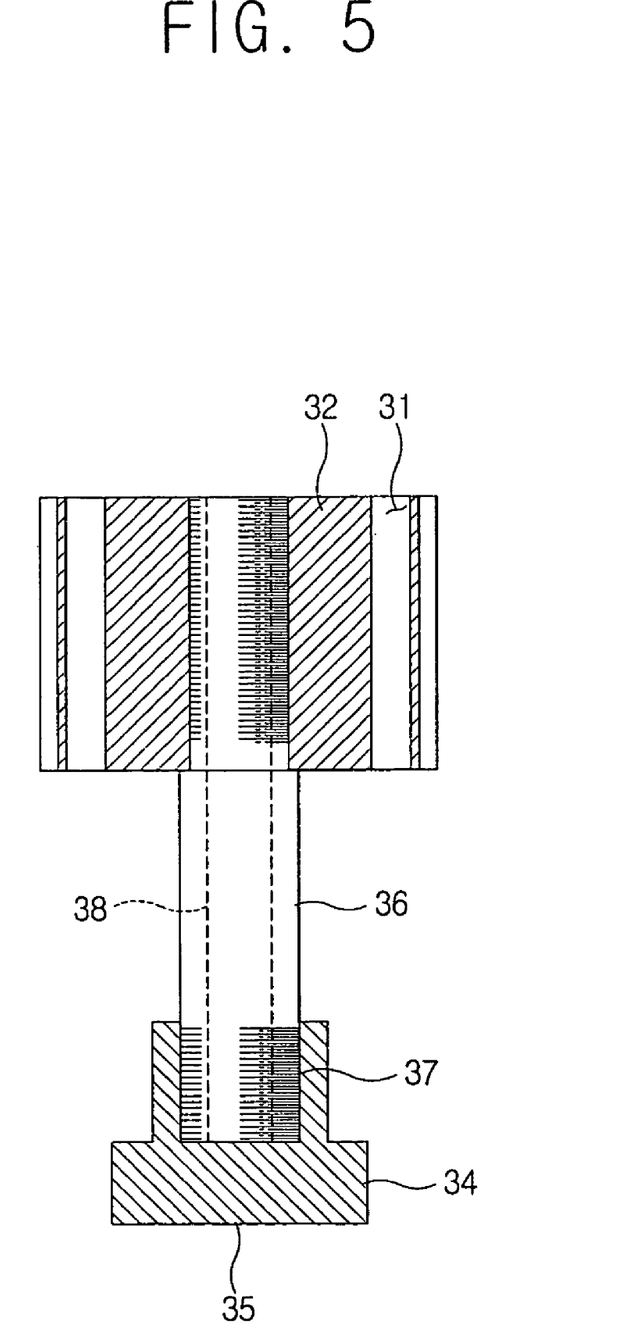
FIG. 5 is a cross-sectional view of the radiator as shown in FIG. 4 taken along line V—V.

The radiator 30 transfers heat from a semiconductor device 70 to the outside. As illustrated in FIGS. 3, 4, and 5, the radiator 30 comprises a heat sink 32, a contact pusher 34 to contact the semiconductor device 70, and a heat flat pusher 36, opposite sides of which combine with the contact pusher 34 and the heat sink 32, respectively, to transfer the heat from the semiconductor device 70 to the heat sink 32 via the contact pusher 34.

The heat sink 32 absorbs the heat transferred from a semiconductor device 70 through the contact pusher 34 and the heat flat pusher 36 and radiates the heat away from the semiconductor device. The heat sink 32 is formed with a plurality of groove strips 31 on a cylindrical surface to increase the area contacting air. Additionally, the center of the heat sink 32 is formed with an insertion hole 33 passing through the heat sink 32 in a direction parallel with the groove strips 31 The inside of the insertion hole 33 is threaded to screw/combine with a first end of the heat flat pusher 36 inserted into the insertion hole 33.

According to an aspect of the present invention, the heat sink 32 is made of aluminum or a material containing aluminum, due to aluminum's high thermal conductivity and competitive price. The structure of the heat sink 32 may vary to improve efficiency of radiation.

A first side of the contact pusher 34 is formed with a flat contacting face 35 to physically contact the semiconductor device 70. A second side of the contact pusher 34 is formed with a combining hole 37 to combine with a second end of the heat flat pusher 36 having the first end inserted into the insertion hole 33 of the heat sink 32. The inside of the combining hole 37 is female-threaded to screw/combine with the second end of the heat flat pusher 36 inserted into the combining hole 37.

The heat flat pusher 36 is a rod with a predetermined length. The circumference of the first end of the heat flat pusher 36 is male-threaded to screw/combine with the female-threaded insertion hole 33 of the heat sink 32. The circumference of the second end of the heat flat pusher 36 is male-threaded to screw/combine with the female-threaded combining hole 37 of the contact pusher 34. Accordingly, the heat sink 32, the contact pusher 34, and a heat flat pusher 36 form the radiator 30, as the first end of the heat flat pusher 36 combines with the heat sink 32 and the second end of the heat flat pusher 36 combines with the contact pusher 34.

The heat flat pusher 36 and the contact pusher 34 are made of the aluminum or a material containing the aluminum, similar to the heat sink 32, because aluminum has a high thermal conductivity and a competitive price.

As illustrated in FIG. 5, a heat pipe 38 is installed inside the heat flat pusher 36 to accelerate the transfer of the heat from the semiconductor device 70 to the heat sink 32 via the contact pusher 34.

The heat pipe 38 is a metallic tube, and contains a working fluid sealed in the inner space which maintains a vacuum. The working fluid occupies 10 to 50 percent of the volume of the inner space of the heat pipe 38.

A first end of the heat pipe 38 is disposed close to the contact pusher 34 and a second end is disposed close to the heat sink 32. Accordingly, the working fluid inside the heat pipe 38 accelerates the transfer of the heat from the contact pusher 34 to the heat sink 32.

In the radiation unit 30 having the configuration described above, the heat transfer path begins with the contact pusher 34 absorbing the heat and ends at the heat sink 32. The heat transfer from the heat flat pusher 36 to the heat sink 32 is enhanced by the high thermal conductivity of the heat pipe 38 installed inside the heat flat pusher 36. Therefore, heat can be transferred from the semiconductor device 70 to the heat sink 32 quickly.

As illustrated in FIG. 2 and FIG. 6, the tester 40 of the contact module 50 comprises a contact block 42 combined with the match plate 20, and a lead pusher 44 provided under the contact block 42 to contact the leads 72 of the semiconductor device 70 selectively by changing the elevation of the contact block 42 which is elastically interlinked with the match plate 20.

The contact block 42 is provided with a heat sink seat 41 to accommodate the heat sink 32, wherein the middle of the heat sink seat 41 is formed with a through hole 43 through which the heat flat pusher 36 passes. A side wall of the heat sink seat 41 is formed with an air outlet (not shown) to let out heated air that flowed in through an opening (not shown) formed on the upper side of the heat sink seat 41. Air enters the heat sink seat 41 of the contact block 42 through the opening, contacts the heat sink 32, absorbs the heat transferred to the heat sink 32 via the flat pusher 36, and is exhausted through the air outlet of the contact block 42.

The lead pusher 44 tests the durability of a semiconductor device 70 against heat by contacting the lead 72 of the semiconductor device 70 and electrically connecting the lead 72 to a test circuit (not shown).

A first elastic member 80 is installed on the heat flat pusher 36 of the radiator 30, and a second elastic member 90 is installed between the match plate 20 and the contact block 42. As the match plate 20 is lowered, the contact block 42, which is elastically combined with the match plate 20, presses the contact pusher 34 against a semiconductor device 70, and presses the lead pusher 44 against the leads 72 of the semiconductor device 70.

The first elastic member 80 elastically changes the elevation of the contact block 42 to press the contact pusher 34 against the semiconductor device 70. The match plate 20 and the contact block 42 are elastically combined by the second elastic member 90.

The first elastic member 80 and the second elastic member 90 may be made of various elastic materials. A spring may be used due to its simple structure and superior elasticity.

Operation of the inspecting apparatus for semiconductor devices according to an aspect of the present invention will be described in reference to FIG. 7A, or FIG. 7C.

The semiconductor device 70 is first inserted into the chamber. The semiconductor device 70 is positioned corresponding to the bottom of the contact pusher 34 as shown in FIG. 7A.

The contacting face 35 of the contact pusher 34 contacts the top of the semiconductor device 70 by operation of the match plate 20 as shown in FIG. 7B. After physical contact has been established between the contacting face 35 of the contact pusher 34 and the semiconductor device 70, the match plate 20 descends enough to press the lead pusher 44 against the leads 72 of the semiconductor device 70. Herein, the contact block 42 moves by the operation of the match plate 20 electrically connecting the lead pusher 44 to the test circuit (not shown) to execute the test as shown in FIG. 7C.

A process to radiate the heat from the semiconductor device 70 to the outside is executed in following order. First, the contact pusher 34 contacts the top of the semiconductor device 70 and then absorbs heat from the semiconductor device 70, and the heat is then transferred to the heat flat pusher 36 from the contact pusher 34. Herein, the heat pipe 38 of high thermal conductivity provided in the heat flat pusher 36 enhances the transfer of the heat from the heat flat pusher 36 to the heat sink 32. Accordingly, the heat transferred to the heat sink 32 from the semiconductor device 70 is absorbed by the air as the air passes through the opening 45, contacts the heat sink 32, and is exhausted to the outside.

As illustrated above, the inspecting apparatus for semiconductor devices according to the present invention can transfer heat from a semiconductor device 70 quickly and efficiently to the outside during testing, thereby maintaining a constant temperature in the tester during testing so that the results of the test can be more accurate.

Accurate testing eliminates faulty test results caused by incorrectly identifying qualified semiconductor devices as defective semiconductor devices. Thereby eliminating the need to repeat the testing, and reducing the accompanying additional expenses and decline of productivity.

Also, the radiation unit 30 according to the present invention may be applied to various devices with improved compatibility.

As described above, the inspecting apparatus for a semiconductor device according to the present invention performs testing at a constant temperature, regardless of heat from the semiconductor device, by transferring heat from the semiconductor device quickly and efficiently, resulting in more accurate test results.

The inspecting apparatus for semiconductor devices according to the present invention improves productivity and saves expense by eliminating faulty test results caused by incorrectly identifying qualified semiconductor devices as defective semiconductor devices.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An inspecting apparatus for a semiconductor device comprising:
   a match plate;
   a contact module combinable with the match plate and comprising a radiator to radiate heat from the semiconductor device to the outside, and a tester to press leads of the semiconductor device; and
   a heat pipe provided in the radiator, wherein the radiator comprises:
      a heat sink;
      a contact pusher to contact the semiconductor device; and
      a heat flat pusher provided between the contact pusher and the heat sink,
      wherein the heat pipe is provided inside the heat flat pusher to transfer the heat from the semiconductor device to the heat sink via the contact pusher.

2. The inspecting apparatus according to claim 1, wherein the tester comprises:
   a contact block combined with the match plate and having a heat sink seat to accommodate the heat sink and a through hole through which the heat flat pusher passes; and
   a lead pusher combined with a bottom of the contact block, and pressing the leads of the semiconductor device selectively by elevation of the contact block by the match plate.

3. The inspecting apparatus according to claim 2, wherein the contact block is formed with an air inlet through which air flows into the heat sink seat and an air outlet through which the air is exhausted to the outside.

4. The inspecting apparatus according to claim 3, further comprising a first elastic member installed on a circumferential part of the heat flat pusher to lift the contact block and the lead pusher up and down elastically.

5. The inspecting apparatus according to claim 4, further comprising a second elastic member installed between the match plate and the contact block to press the lead pusher against the leads of the semiconductor device by elevation of the contact block elastically by the match plate.

6. The inspecting apparatus according to claim 5, wherein the first elastic member and the second elastic member comprise springs, respectively.

7. The inspecting apparatus according to claim 1, wherein the heat sink, the contact pusher, and the heat flat pusher are made of material containing aluminum.

8. The inspecting apparatus according to claim 1, wherein the heat pipe is a metallic tube.

9. The inspecting apparatus according to claim 1, wherein the heat pipe comprises an inner space.

10. The inspecting apparatus according to claim 9, wherein the heat pipe contains a working fluid sealed in the inner space.

11. The inspecting apparatus according to claim 10, wherein the inner space maintains a vacuum.

12. The inspecting apparatus according to claim 10, wherein the working fluid occupies 10 to 50 percent of a volume of the inner space.

13. The inspecting apparatus according to claim 1, wherein the heat pipe comprises:
   a first end disposed close to the contact pusher; and
   a second end disposed close to the heat sink.

14. The inspecting apparatus according to claim 13, wherein the heat pipe comprises an inner space to contain a working fluid, and the working fluid accelerates a transfer of the heat from the contact pusher to the heat sink.

15. The inspecting apparatus according to claim 1, wherein the heat pipe has a high thermal conductivity.

16. The inspecting apparatus according to claim 1, wherein the heat pipe is made of aluminum.

17. A radiator for a semiconductor inspecting device comprising:
   a heat sink;
   a contact pusher to contact a semiconductor device;
   a heat pipe provided between the heat sink and the contact pusher to transfer heat from the semiconductor device from the contact pusher to the heat sink;
   wherein the heat pipe comprises an inner space containing a working fluid.

18. The radiator according to claim 17, wherein the working fluid occupies 10 to 50 percent of a volume of the inner space.

19. The radiator according to claim 17, wherein the heat pipe is made of aluminum.

20. An apparatus for testing semiconductor devices comprising:

a match plate having a plurality of combining holes; and
a plurality of contact modules combined with the plurality of combining holes respectively, the contact modules comprising:
  a plurality of contact pushers to transfer heat from the semiconductor devices,
  a plurality of heat flat pushers respectively comprising a plurality of heat pipes, the heat flat pushers combined with the contact pushers respectively, to transfer heat from the contact pushers,
  a plurality of heat sinks to transfer heat from the heat flat pushers and to radiate the heat away from the semiconductor devices, the heat sinks being combined with the heat flat pushers respectively, and formed with a plurality of grooves to increase a surface area of the heat sinks,
  a plurality of lead pushers to selectively contact leads of the semiconductor devices, and
a contact block combined with the lead pushers, the contact block being elastically combined with the contact pushers by a plurality of first elastic devices and elastically combined with the match plate by a plurality of second elastic devices, the contact block being formed with a plurality of through holes in which the heat flat pushers are located.

21. An inspecting apparatus for a semiconductor device comprising:
a match plate;
a contact module combined with the match plate, the contact module comprising:
  a radiator to contact the semiconductor device, wherein the radiator comprises,
    a heat sink,
    a contact pusher to contact the semiconductor device having the thermally conductive pad attached to a contacting face, and
    a heat flat pusher combined with the contact pusher and the heat sink to transfer heat from the semiconductor device to the heat sink via the contact pusher; and
  a tester to contact leads of the semiconductor device, wherein the tester comprises:
    a contact block combined with the match plate, and formed with a heat sink seat to accommodate the heat sink, and with a through hole through which the heat flat pusher passes; and
    a lead pusher combined with a bottom of the contact block, to contact the leads of the semiconductor device selectively according to a positioning of the contact block.

22. The inspecting apparatus according to claim 21, wherein the contact block is formed with an air inflow hole and an air outflow hole to increase air circulation and improve cooling.

23. The inspecting apparatus according to claim 21, further comprising a first elastic member installed on the circumference of the heat flat pusher to elastically connect the contact block and the lead pusher.

24. The inspecting apparatus for the semiconductor device according to claim 21, further comprising a second elastic member installed between the match plate and the contact block, to allow the contact block to move up and down elastically corresponding to ascent and descent of the match plate, thereby pressing the lead pusher against the leads of the semiconductor device.

25. The inspecting apparatus for the semiconductor device according to claim 23, further comprising a second elastic member installed between the match plate and the contact block, to allow the contact block to move up and down elastically corresponding to ascent and descent of the match plate, thereby pressing the lead pusher against the leads of the semiconductor device.

26. The inspecting apparatus for the semiconductor device according to claim 23, wherein the first elastic member comprises a spring.

27. The inspecting apparatus for the semiconductor device according to claim 24, wherein the second elastic member comprises a spring.

* * * * *